United States Patent
Li et al.

(10) Patent No.: US 11,397,206 B2
(45) Date of Patent: Jul. 26, 2022

(54) TIME DOMAIN CALCULATION METHOD OF VOLTAGE TRAVELING-WAVE DIFFERENTIAL PROTECTION FOR VSC-HVDC TRANSMISSION LINES

(71) Applicant: Tianjin University, Tianjin (CN)

(72) Inventors: Botong Li, Tianjin (CN); Mingrui Lv, Tianjin (CN); Bin Li, Tianjin (CN)

(73) Assignee: Tianjin University, Tianjin (CN)

( * ) Notice: Subject to any disclaimer, the term of this patent is extended or adjusted under 35 U.S.C. 154(b) by 210 days.

(21) Appl. No.: 16/316,043

(22) PCT Filed: Nov. 24, 2017

(86) PCT No.: PCT/CN2017/112767
§ 371 (c)(1),
(2) Date: Jan. 8, 2019

(87) PCT Pub. No.: WO2019/080238
PCT Pub. Date: May 2, 2019

(65) Prior Publication Data
US 2021/0373064 A1    Dec. 2, 2021

(30) Foreign Application Priority Data
Oct. 29, 2017  (CN) .......................... 201711028925.7

(51) Int. Cl.
*G01R 31/08*  (2020.01)

(52) U.S. Cl.
CPC ......... *G01R 31/088* (2013.01); *G01R 31/085* (2013.01)

(58) Field of Classification Search
None
See application file for complete search history.

(56) References Cited

U.S. PATENT DOCUMENTS 10,141,736 B2 * 11/2018 Li .......................... G01R 31/085
10,725,085 B2 *  7/2020 Dzienis ................ G01R 31/085
(Continued)

OTHER PUBLICATIONS

Suonan, J; Zhang, J; Jiao, Z; Distance Protection for HVDC Transmission Lines Considering Frequency-Dependent Parameters; Apr. 2013; IEEE Transactions on Power Delivery, vol. 28, No. 2, p. 723-732 (Year: 2013).*

*Primary Examiner* — Arleen M Vazquez
*Assistant Examiner* — Terence E Stifter, Jr.
(74) *Attorney, Agent, or Firm* — George G. Wang; Bei & Ocean

(57) ABSTRACT

The present invention related to the field of power system protection and control, presents a voltage travelling wave differential protection method considering the influence of frequency-dependent parameters, which provides more accurate and rapid fault identification. The technical scheme of the present invention is as follows: a calculation method of voltage travelling-wave differential protection for VSC-HVDC transmission lines, taking the influence of the frequency-dependent parameters into consideration, the steps are as follows: calculating a characteristic impedance and propagation coefficient of the frequency-dependent transmission line in time domain, collecting voltage and current signals at the both ends of the transmission line and then calculating the forward and backward voltage travelling wave, respectively, comparing a differential value of voltage travelling wave with a preset threshold value to determine whether the internal fault occurs.
The present invention is mainly applied in the field of power system protection and control.

8 Claims, 3 Drawing Sheets

(56) References Cited

U.S. PATENT DOCUMENTS

2015/0233976 A1\* 8/2015 Johannesson .......... G01R 31/40
                                                        324/764.01
2017/0082675 A1\* 3/2017 Schweitzer, III .... H02H 1/0007

\* cited by examiner

TIME DOMAIN CALCULATION METHOD OF VOLTAGE TRAVELING-WAVE DIFFERENTIAL PROTECTION FOR VSC-HVDC TRANSMISSION LINES

TECHNICAL FIELD

The invention relates to the field of power system protection and control, especially to the travelling-wave differential protection of VSC-HVDC transmission lines, and proposes a calculation method of voltage travelling-wave differential protection for VSC-HVDC transmission lines considering the frequency-dependent line parameters.

BACKGROUND OF THE PRESENT INVENTION

Voltage Source Converter Based High Voltage Direct Current (VSC-HVDC) is a novel High Voltage Direct Current (HVDC) based on Voltage Source Converter (VSC) and full-controlled turn-off electronic device. The VSC-HVDC has the advantages such as high economic efficiency, flexibility and environmental friendly protection, and is one of the key techniques in the research and application of smart grid. At present, the VSC-HVDC adopts Modular Multilevel converters (MMC) to convert AC to DC. Due to the small damping at DC side, the current suddenly rises and voltage drops rapidly when a short circuit occurs on the VSC-HVDC transmission line, which will extremely threaten the security of system and device. Therefore, it is important to develop a protection principle of fast, reliable and selective identifying faults so as to ensure the security and stability of the VSC-HVDC transmission systems.

Currently, the protection of the VSC-HVDC transmission lines still follows the conventional transmission line protection strategy of the HVDC system, which uses travelling wave protection as a fast main protection and current differential protection as a backup protection. The conventional longitudinal differential protection has the advantages such as good selectivity and high sensitivity, but also has long time delay and cannot meet the speed requirement of the VSC-HVDC system. Besides, the transient electrical quantities of the VSC-HVDC are not the same as the AC system that take the power frequency as main frequency, but comprise rich frequency components. And the transmission process of these quantities in the DC line is greatly affected by the line frequency-dependent parameters. Therefore, taking the influence of the frequency-dependent line parameters of the VSC-HVDC system into consideration and decreasing time delay of the longitudinal differential protection are the basic premises for the protection principle to be successfully applied to the VSC-HVDC transmission line and developing its inherent advantages.

SUMMARY OF THE PRESENT INVENTION

In order to overcome the defects of the prior art, in view of the fact that the conventional longitudinal differential protection of the VSC-HVDC transmission lines does not take the frequency-dependent line parameters into consideration and the problems that the long time delay is not conducive to the rapid identification of the fault, the present invention provides a voltage travelling-wave differential protection method considering the frequency-dependent characteristic of line parameters. The proposed method of the present invention provides more accurate and rapid detection of the internal fault. The technical scheme of the present invention is as follows: a calculation method of voltage travelling-wave differential protection for VSC-HVDC transmission lines, considering the influence of the frequency-dependent characteristic of line parameters, the steps are as follows: calculating the characteristic impedance and propagation coefficient of the frequency-dependent transmission line in time domain, collecting the voltage and current signals at the both ends of the transmission line and then calculating the forward and backward voltage travelling-wave respectively, comparing the differential value of the above voltage travelling-waves with the preset threshold to determine whether the internal fault occurs.

The detailed steps in an embodiment are as follows:

Step A: calculating a characteristic impedance and a propagation coefficient of the frequency-dependent transmission line in time domain;

Step B: collecting voltage and current signals at the both ends of the transmission line, comprising a head end voltage value $u_m$, a head end current value $i_m$, a tail end voltage value $u_n$, a tail end current value $i_n$ of the transmission line, a sampling frequency $f_s$, and a number of the sampling voltage and current $N_s$; according to the waveform reduction method, filtering and intercepting the voltage and current signals using a filter with kernel length of $M_2$ and then increasing the sampling frequency $f_s$ to a resampling frequency $f_{maxres}$ ($f_{maxres} > f_s$), and the number of sampling points becoming $N_x - M_2/2$, wherein $N_x = N_s \cdot f_{maxres}/f_s$; and performing phase mode transformation;

Step C: comparing a differential value of voltage travelling-wave with a preset threshold value so as to determine whether the internal fault occurs:

Calculating differential values of voltage travelling-wave $uwave_{diffm}$ and $uwave_{diffn}$ at both ends, presetting a preset threshold value $u_{set}$, determining whether the internal fault occurs on the transmission line based on the criterion of $uwave_{diffm}[n_3] \geq u_{set}|uwave_{diffn}[n_3] \geq u_{set}$ ($n_3 = 1, 2 \ldots N_x - M_2/2$), and using the differential-mode components of voltage and current to realize fault recognition; and then further determining whether the internal fault occurs;

$$uwave_{diffm}[n_3] \geq u_{set}|uwave_{diffn}[n_3] \geq u_{set}$$

That is, when either of $uwave_{diffm}[n_3]$ or $uwave_{diffn}[n_3]$ is greater than the preset threshold value $u_{set}$, it is considered that the internal fault occurs at a time $t[n_3]$. In order to ensure the reliability of the determination, the determination is made continuously several times or by the integral method.

The detailed steps of Step A are as follows:

Step A-1: according to a conductance matrix G and geometric transmission line parameters including a radius of conductor, an average above-ground height of the conductor, a distance between the conductors, a distance between the conductor and the mirror of another conductor, obtaining an impedance matrix of the conductor by the Carson formula, obtaining a capacitance matrix using the potential coefficient matrix, and then calculating the expression of the characteristic impedance and propagation coefficient corresponding to a full length l of the transmission line in frequency domain, and finally transforming it into the time domain by rational function fitting or inverse Fourier transformation;

Step A-2: in order to match the calculated characteristic impedance and propagation coefficient with the collected voltage and current in frequency domain, filtering the characteristic impedance and propagation coefficient by a sinc filter with a Blackman window;

Step A-3: reducing the sampling frequency $f_s$ of the filtered characteristic impedance and propagation coefficient corresponding to the full length of the transmission line to the resampling frequency $f_{maxres}$.

The detailed steps of step A-1 are:

Setting a sampling time $t_{max}$, a sampling frequency $f_{max}$, a number of sampling points $N_t$ in time domain and a number of sampling points $N_f$ in frequency domain as:

$$N_t = N_f = t_{max} \cdot f_{max}$$

Calculating a sampling time $t[n_1]$ corresponding to the $n_1^{th}$ sampling point:

$$t[n_1] = (n_1 - 1)/f_{max}$$

Where $n_1 = 1, 2, 3 \ldots N_t$, calculating a frequency $f[n_1]$ corresponding to the $n_1^{th}$ sampling point:

$$f[n_1] = (n_1 - 1)/t_{max}$$

Step (1): calculating an impedance matrix Z using Carson formula:

Self-impedance $Z_{si}$ (i=1,2) is:

$$Z_{si} = (R_{i,ac} + \Delta R_{si}) + j\left(\omega \frac{\mu_0}{2\pi} \ln \frac{2h_i}{r_i} + X_{i,ac} + \Delta X_{si}\right)$$

Where $R_{i,ac}$ is an AC resistance of the conductor i, $X_{i,ac}$ is an AC reactance of the conductor i, $\Delta R_{si}$ and $\Delta X_{si}$ are Carson's correction terms for earth return effects, $h_i$ is an average above-ground height of the conductor i, $r_i$ is a radius of the conductor i, $\mu_0$ having the value of $4\pi \times 10^{-4}$ H/m is the uniform permeability for both the aerial space and the earth; and angular frequency $\omega = 2\pi f[n_1]$;

Mutual impedance $Z_{mij}$ is:

$$Z_{mij} = Z_{mji} = \Delta R_{mij} + j\left(\omega \frac{\mu_0}{2\pi} \ln \frac{d_{ij,mir}}{d_{ij}} + \Delta X_{mij}\right)$$

Where j=1,2 and j≠i, $d_{ij}$ is a distance between conductor i and conductor j, $d_{ij,mir}$ is a distance between the conductor i and the mirror of conductor j, $\Delta R_{mij}$ and $\Delta X_{mij}$ are Carson's correction terms for earth return effects;

$$Z = \begin{bmatrix} Z_{s1} & Z_{m12} \\ Z_{m21} & Z_{s2} \end{bmatrix}$$

Step (2): calculating a potential coefficient matrix P:

$$P_{si} = \frac{1}{2\pi\varepsilon_0} \ln \frac{2h_i}{r_i}$$

$$P_{mij} = P_{mji} = \frac{1}{2\pi\varepsilon_0} \ln \frac{d_{ij,mir}}{d_{ij}}$$

Where $P_{si}$ is a diagonal element of matrix P, $P_{mij}$ is a off-diagonal element of matrix P, $\varepsilon_0$ is a space permittivity value having the value of $8.85 \times 10^{-12}$ F/m, and a capacitance matrix $C = P^{-1}$;

Step (3): performing phase mode transformation:

$$Z' = SZS^{-1}$$

$$C' = SCS^{-1}$$

$$G' = SGS^{-1}$$

Where Z' is a modulus of the impedance per unit length of the conductor, C' is a modulus of the capacitance per unit length of the conductor, G' is a modulus of the conductance per unit length of the conductor, and S is a decoupling matrix, $$S = \frac{1}{2}\begin{bmatrix} 1 & -1 \\ 1 & 1 \end{bmatrix};$$

Step (4): calculating the function of a characteristic impedance $Z_c$ and a propagation coefficient A in frequency domain:

$$Z' = R' + j\omega L'$$

$$Z_c(\omega) = \sqrt{\frac{R' + j\omega L'}{G' + j\omega C'}}$$

$$A(\omega) = e^{-l\sqrt{(R' + j\omega L')(G' + j\omega C')}}$$

Where R' is a resistance per unit length of the conductor, L' is an inductance per unit length of the conductor;

Step (5): converting the functions from the frequency domain into the time domain using rational function fitting method:

Fitting functions $Z_c(\omega)$ and $A(\omega)$ in the frequency domain by the rational function fitting method, a point where the slope of the fitted line changes is a pole and zero point of the rational function, so the approximate expression of the characteristic impedance and the propagation coefficient in the frequency domain are:

$$Z_{c,approx}(s) = k \frac{(s + z_1)(s + z_2) \ldots (s + z_{m1})}{(s + p_1)(s + p_2) \ldots (s + p_{m1})}$$

$$A_{approx}(s) = e^{-s\tau_{min}} k \frac{(s + z_1)(s + z_2) \ldots (s + z_{m1})}{(s + p_1)(s + p_2) \ldots (s + p_{m2})}$$

Where $s = j\omega$ and $m1 < m2$; $z_{m1}$ is the zero point, $m1 = 1, 2, 3 \ldots$, $P_{m2}$ is the pole, $m2 = 1, 2, 3 \ldots$, the zero and pole point are both negative real numbers; k is an coefficient, $\tau_{min}$ is a shortest propagation time of the wave; $Z_{c,approx}(s)$ is the rational function approximation of characteristic impedance, $A_{approx}(s)$ is the rational function approximation of propagation coefficient;

Converting the functions into the time domain:

$$Z_c(t) = k_0\delta(t) + k_1 e^{-p_1 t} + k_2 e^{-p_2 t} + \ldots + k_{m1} e^{-p_{m1} t}$$

$$a(t) = \begin{cases} k_1 e^{-p_1(t - \tau_{min})} + k_2 e^{-p_2(t - \tau_{min})} + \ldots + k_{m2} e^{-p_{m2}(t - \tau_{min})}, & \text{if } t \geq \tau_{min} \\ 0 & \text{if } t < \tau_{min} \end{cases}$$

Where $Z_c(t)$ is a time domain expression of the characteristic impedance, a(t) is a time domain expression of the propagation coefficient, $k_{m2}$ is a coefficient of the expanded rational function; the characteristic impedance $Z_c[n_1]$ and the propagation coefficient $a[n_1]$ corresponding to each sampling time $t[n_1]$ can be achieved.

The detailed steps of Step A-2 are:
Calculating a kernel $h[j_1]$ of a sinc filter with Blackman window:

$$\begin{cases} h[j_1] = K \dfrac{\sin(2\pi f_c(j_1 - M/2))}{j_1 - M/2} w[j_1] & j_1 \neq M/2 \\ h[j_1] = 2\pi f_c & j_1 = M/2 \end{cases}$$

Performing Normalization:

$$h[j_1] = \dfrac{h[j_1]}{\sum_{i=1}^{M+1} h[j_1]}$$

Where $j_1 = 1, 2 \ldots M+1$, $f_c$ is the cut-off frequency having the value within the range of 0 to 0.5; M is a kernel length of the filter, which should be an even number; K is the coefficient; $w[j_1]$ is the function of Blackman window and is expressed as follows:

$$w[j_1] = 0.42 - 0.5 \cos(2\pi j_1/M) + 0.08 \cos(4\pi j_1/M)$$

Performing Filtering $$z_{cfilter}[n_1 + j_1 - 1] = \sum_{j_1=1}^{M+1} h[j_1] z_c[n_1],$$

$$a_{filter}[n_1 + j_1 - 1] = \sum_{j_1=1}^{M+1} h[j_1] a[n_1]$$

Where $n_1 = 1, 2 \ldots N_t$; $Z_{cfilter}$ is a filtered characteristic impedance; $a_{filter}$ is a filtered propagation coefficient; the filtered signal has a delay of M/2 point compared with the original signal, so the filtered point corresponding to the sampling time $t[n_1]$ is $Z_{cfilter}[n_1+M/2]$ and $a_{filter}[n_1+M/2]$.

The detailed steps of Step A-3 are:
Calculating the number of resampling points $N_{tres}$ in the time domain:

$$N_{tres} = t_{max} \cdot f_{maxres}$$

Where $f_{maxres}$ is the resampled sampling frequency;
Calculating the sampling time $t_{new}[n_2]$ corresponding to the $n_2^{th}$ sampling point:

$$t_{new}[n_2] = (n_2 - 1)/f_{maxres}$$

$n_2 = 1, 2, 3 \ldots N_{tres}$, and obtaining the resampled sampling value by linear interpolation method:

$$z_{cres}[n_2] = \dfrac{z_{c2} - z_{c1}}{t_2 - t_1} \cdot (t_{new}[n_2] - t_1) + z_{c1}$$

$$a_{res}[n_2] = \dfrac{a_2 - a_1}{t_2 - t_1} \cdot (t_{new}[n_2] - t_1) + a_1$$

Where $Z_{cres}$ is a resampled characteristic impedance; $a_{res}$ is a resampled propagation coefficient; $t_1$ and $t_2$ are two adjacent sampling times in the original sampling time series t, and $t_1 \leq t_{new}[n_2] \leq t_2$; $z_{c1}$ and $z_{c2}$ are sampling values corresponding to the sampling times $t_1$, $t_2$ in the filtered characteristic impedance $Z_{cfilter}$, respectively; $a_1$ and $a_2$ are sampling values corresponding to the sampling times $t_1$, $t_2$ in the filtered propagation coefficient $a_{filter}$ respectively.

The detailed steps of Step B are as follows:
Step B-1: calculating according to the waveform reduction method:
Step(1): Setting the frequency for traveling-wave transmission calculation as $f_{maxres}$, inserting zero points to an original signal $x[i_2]$ according to the new sampling rate, $i_2 = 1, 2, \ldots N_s$, so that the number of sampling points is changed from $N_s$ to $N_x$, $N_x = N_s \cdot N_{add}$, $N_{add} = f_{maxres}/f_s$, thus obtaining a recombinant signal $x_{rec}[i_3]$:

$x_{rec}[1 + (i_2 - 1) \cdot N_{dd}] = x[i_2]$, the values of the rest points are zero;

Where, $i_3 = 1, 2 \ldots N_x$; x represents sampling values including voltages $u_m$, $u_n$ and currents $i_m$, $i_n$ at the sampling frequency $f_s$; and $x_{rec}$ represents sampling values including voltages $u_{mrec}$, $u_{nrec}$ and currents $i_{mrec}$, $i_{nrec}$ at the sampling frequency $f_{max}$ after inserting the zero points;

Step (2): filtering the recombinant signal $x_{rec}[i_3]$ using the sinc filter with Blackman window, setting a cut-off frequency $f_{c2} = 1/(2 \cdot N_{add})$, choosing an appropriate kernel length $M_2$ and a kernel $h_2[j_2]$ of the filter, and filtering out harmonics at higher frequencies:

$$x_{restore}[i_3 + j_2 - 1] = \sum_{j_2=1}^{M_2+1} h_2[j_2] x_{rec}[i_3]$$

Where $j_2 = 1, 2 \ldots M_2+1$ and $i_3 = 1, 2 \ldots N_x$; $x_{restore}$ represents voltage values $u_{mrestore}$, $u_{nrestore}$ and currents values $i_{mrestore}$, $i_{nrestore}$ after waveform reduction;

Step (3): intercepting the restored voltage and current signals, namely, removing the previous and subsequent $M_2/2$ sampling points of the signal $x_{restore}$; the restored signal is $x_{restore}[i_3 + M_2/2]$ corresponding to the sampling time $t[i_3]$, the intercepted signal after waveform reduction is $x_{re}[n_3]$ ($n_3 = 1, 2 \ldots N_x - M_2/2$), and $x_{re}[n_3] = x_{restore}[n_3 + M_2/2]$; $x_{re}$ represents intercepted voltage values $u_{mre}$, $U_{nre}$ and intercepted currents values $i_{mre}$, $i_{nre}$ after waveform reduction.

Step B-2: performing phase mode transformation:

$$\begin{bmatrix} u_{mmod1} \\ u_{mmod2} \end{bmatrix} = \begin{bmatrix} \dfrac{\sqrt{2}}{2} & \dfrac{\sqrt{2}}{2} \\ \dfrac{\sqrt{2}}{2} & -\dfrac{\sqrt{2}}{2} \end{bmatrix} \begin{bmatrix} u_{mp} \\ u_{mn} \end{bmatrix}$$

$$\begin{bmatrix} u_{nmod1} \\ u_{nmod2} \end{bmatrix} = \begin{bmatrix} \dfrac{\sqrt{2}}{2} & \dfrac{\sqrt{2}}{2} \\ \dfrac{\sqrt{2}}{2} & -\dfrac{\sqrt{2}}{2} \end{bmatrix} \begin{bmatrix} u_{np} \\ u_{nn} \end{bmatrix}$$

$$\begin{bmatrix} i_{mmod1} \\ i_{mmod2} \end{bmatrix} = \begin{bmatrix} \dfrac{\sqrt{2}}{2} & \dfrac{\sqrt{2}}{2} \\ \dfrac{\sqrt{2}}{2} & -\dfrac{\sqrt{2}}{2} \end{bmatrix} \begin{bmatrix} i_{mp} \\ i_{mn} \end{bmatrix}$$

$$\begin{bmatrix} i_{nmod1} \\ i_{nmod2} \end{bmatrix} = \begin{bmatrix} \dfrac{\sqrt{2}}{2} & \dfrac{\sqrt{2}}{2} \\ \dfrac{\sqrt{2}}{2} & -\dfrac{\sqrt{2}}{2} \end{bmatrix} \begin{bmatrix} i_{np} \\ i_{nn} \end{bmatrix}$$

Where the voltage values $u_{mmod1}$, $u_{nmod1}$ and current values $i_{mmod1}$, $i_{nmod1}$ are ground-mode components after waveform reduction; and voltage values $u_{mmod2}$, $u_{nmod2}$ and current values $i_{mmod2}$, $i_{nmod2}$ are differential-mode components after waveform reduction; voltage values $u_{mp}$, $u_{mn}$ are p-phase and n-phase of the voltage value $u_{mre}$, respectively; voltage values $u_{np}$, $u_{nn}$ are p-phase and n-phase of the voltage value $u_{nre}$, respectively; current values $i_{mp}$, $i_{mn}$ are p-phase and n-phase of the current value $i_{mre}$, respectively; current values $i_{np}$, $i_{nn}$ are p-phase and n-phase of the current value $i_{nre}$, respectively.

The detailed steps of Step C are as follows:

Calculating the differential values of voltage travelling-wave at both ends:

$$u\text{wave}_{diffn}[n_3]=(u_{mmod2}[n_3]+z_{cres}[n_2]*i_{mmod2}[n_3])*a_{res}[n_2]-(u_{nmod2}[n_3]-z_{cres}[n_2]*i_{nmod2}[n_3])$$

$$u\text{wave}_{diffn}[n_3]=(u_{nmod2}[n_3]+z_{cres}[n_2]*i_{nmod2}[n_3])*a_{res}[n_2]-(u_{mmod2}[n_3]-z_{cres}[n_2]*i_{mmod2}[n_3])$$

Where $n_3=1, 2 \ldots N\,M_2/2$ and $n_2=1, 2 \ldots N_{tres}$; * represents the convolution calculation, the value $u\text{wave}_{diffn}$, is the differential value between the differential-mode forward voltage traveling-wave at the head end after full-length line transmission and the differential-mode backward voltage traveling-wave at the tail end; the value $u\text{wave}_{diffn}$ is the differential value between the differential-mode forward voltage traveling-wave at the tail end after full-length line transmission and the differential-mode backward voltage traveling-wave at the head end;

Calculating the convolution calculation:

Supposing $xx[j_3]$ is an input signal with $N_1$ points, $j_3$ is a positive integer from 1 to $N_1$, $hh[j_4]$ is an impulse response with $N_2$ points, and $j_4$ is a positive integer from 1 to $N_2$. The convolution result of $xx[j_3]$ and $hh[j_4]$ is $y[j_5]$, which is a signal with $N_1+N_2-1$ points, $j_5$ is a positive integer from 1 to $N_1+N_2-1$, then $$y[j_5] = \sum_{j_4=1}^{N_2} hh[j_4]xx[j_5 - j_4]$$

Where $j_5=1, 2 \ldots N_1+N_2-1$ and $j_4=1, 2 \ldots N_2$.

The technical features and beneficial advantages of the present invention:

1. Considering the effect of the frequency-dependent parameters during the transmission of transient electrical quantities in the VSC-HVDC, the method of the present invention is realized based on the electrical quantities at double-end of the line which can meet the requirements of selectivity.

2. Compared with the traditional longitudinal differential protection, the method can shorten the delay while ensuring the calculation accuracy, which is beneficial to the rapid identification of faults, and can be used as the main protection when the length of the transmission line is not too long.

3. The method has clear calculation of voltage traveling wave and is easy to implement.

DETAILED DESCRIPTION OF THE PRESENT INVENTION

Figure 1:
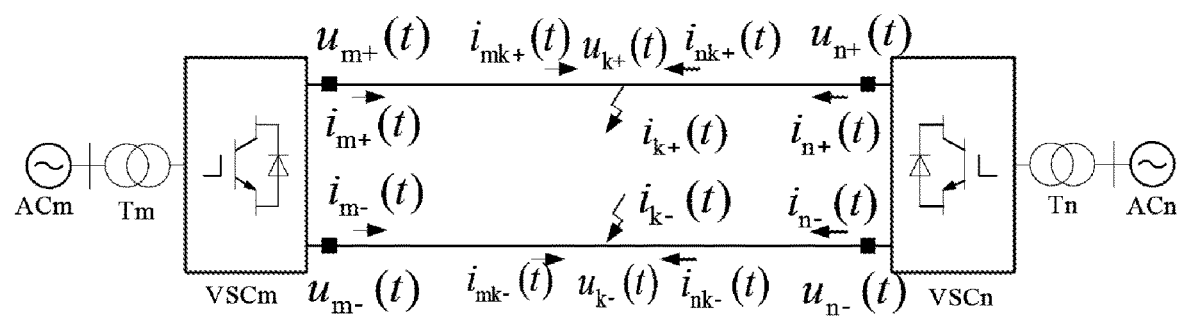
FIG. 1 is the schematic diagram of the VSC-HVDC transmission line.

In order to overcome the defects of the prior art, the present invention provides a calculation method of voltage travelling-wave differential protection for VSC-HVDC transmission lines. The method of the present invention collects the electrical quantity in time domain at the both ends of the transmission line, establishes the frequency-dependent modeling functions of the VSC-HVDC transmission line for calculating the voltage traveling-wave values at both ends, and finally calculates differential value so as to identify whether internal fault occurs. The method can on-line calculate voltage traveling-wave values of the line according to the real-time collected electrical quantity, and can shorten the delay during calculation so as to satisfy the requirements of speed and selectivity of VSC-HVDC system.

The technical scheme of the present invention is as follows: a calculation method of voltage travelling-wave differential protection for VSC-HVDC transmission lines, considering the influence of the frequency-dependent parameters, the steps are as follows: calculating the characteristic impedance and propagation coefficient of the frequency-dependent transmission line in time domain, collecting voltage and current signals at the both ends of the transmission line and then calculating the forward and backward voltage travelling-wave, respectively, comparing the differential value of voltage travelling-wave with the preset threshold value so as to determine whether the internal fault occurs.

An implementation of the present invention will be further described below in detail.

Step A: calculating the characteristic impedance and propagation coefficient of the frequency-dependent transmission line in time domain; the detailed steps are as follows:

Step A-1: according to the conductance matrix G (generally ignored, can be set to 0) and the geometric transmission line parameters including the radius of conductor, the average above-ground height of the conductor, the distance between the conductors, the distance between the conductor and the mirror of another conductor, obtaining the impedance matrix of the conductor by the Carson formula, obtaining the capacitance matrix using the potential coefficient matrix, and then calculating the expression of the characteristic impedance and propagation coefficient corresponding to the full length l of the transmission line in frequency domain, and finally transforming it into the time domain by rational function fitting or inverse Fourier transformation;

Setting the sampling time $t_{max}$, the sampling frequency $f_{max}$, the number of sampling points $N_t$ in time domain and the number of sampling points $N_f$ in frequency domain as:

$$N_t=N_f=t_{max}f_{max}$$

Calculating the sampling time $t[n_1]$ ($n_1=1, 2, 3 \ldots N_t$) corresponding to the $n_1^{th}$ sampling point:

$$t[n_1]=(n_1-1)/f_{max}$$

Calculating the frequency $f[n_1]$ corresponding to the $n_1^{th}$ sampling point:

$$f[n_1]=(n_1-1)/t_{max}$$

a): calculating the impedance matrix Z using Carson formula:

Self-impedance $Z_{si}$ (i=1,2) is:

$$Z_{sj} = (R_{i,ac} + \Delta R_{si}) + j\left(\omega\frac{\mu_0}{2\pi}\ln\frac{2h_i}{r_i} + X_{i,ac} + \Delta X_{si}\right)$$

Where $R_{i,ac}$ is the AC resistance of the conductor i, $X_{i,ac}$ is the AC reactance of the conductor i, $\Delta R_{si}$ and $\Delta X_{si}$ are Carson's correction terms for earth return effects, $h_i$ is the average above-ground height of the conductor i, $r_i$ is the radius of the conductor i, $\mu_0$ having the value of $4\pi \times 10^{-4}$ H/m is the uniform permeability for both the aerial space and the earth; and angular frequency $\omega=2\pi f[n_1]$;

Mutual impedance $Z_{mij}$ (j=1,2 and j≠i) is:

$$Z_{mij} = Z_{mji} = \Delta R_{mij} + j\left(\omega \frac{\mu_0}{2\pi} \ln \frac{d_{ij,mir}}{d_{ij}} + \Delta X_{mij}\right)$$

Where $d_{ij}$ is the distance between conductor i and conductor j, $d_{ij,mir}$ is the distance between the conductor I and the mirror of conductor j, $\Delta R_{mij}$ and $\Delta X_{mij}$ are Carson's correction terms for earth return; and then $$Z = \begin{bmatrix} Z_{s1} & Z_{m12} \\ Z_{m21} & Z_{s2} \end{bmatrix};$$

b): calculating the potential coefficient matrix P:

$$P_{si} = \frac{1}{2\pi\varepsilon_0} \ln \frac{2h_i}{r_i}$$

$$P_{mij} = P_{mji} = \frac{1}{2\pi\varepsilon_0} \ln \frac{d_{ij,mir}}{d_{ij}}$$

Where $P_{si}$ is the diagonal element of matrix P, $P_{mij}$ is the off-diagonal element of matrix P, $\varepsilon_0$ is the space permittivity value having the value of $8.85 \times 10^{-12}$ F/m, and the capacitance matrix $C=P^{-1}$;

c): performing phase mode transformation:

$$Z'=SZS^{-1}$$

$$C'=SCS^{-1}$$

$$G'=SGS^{-1}$$

Where Z' is the modulus of the impedance per unit length of the conductor, C' is the modulus of the capacitance per unit length of the conductor, G' is the modulus of the conductance per unit length of the conductor, and S is the decoupling matrix, $$S = \frac{1}{2}\begin{bmatrix} 1 & -1 \\ 1 & 1 \end{bmatrix};$$

d): Calculating the function of the characteristic impedance $Z_c$ and the propagation coefficient A in frequency domain:

$$Z' = R' + j\omega L'$$

$$Z_c(\omega) = \sqrt{\frac{R' + j\omega L'}{G' + j\omega C'}}$$

$$A(\omega) = e^{-l\sqrt{(R'+j\omega L')(G'+j\omega C')}}$$

Where R' is the resistance per unit length of the conductor, L' is the inductance per unit length of the conductor;

e): converting the functions from the frequency domain into the time domain using rational function fitting method:

Fitting the functions $Z_c(\omega)$ and $A(\omega)$ in the frequency domain by the rational function fitting method, the point where the slope of the fitted line changes is the pole and zero point of the rational function, so the approximate expression of the characteristic impedance and the propagation coefficient in the frequency domain are:

$$Z_{c,approx}(s) = k\frac{(s+z_1)(s+z_2)\dots(s+z_{m1})}{(s+p_1)(s+p_2)\dots(s+p_{m1})}$$

$$A_{approx}(s) = e^{-s\tau_{min}} k\frac{(s+z_1)(s+z_2)\dots(s+z_{m1})}{(s+p_1)(s+p_2)\dots(s+p_{m2})}$$

Where $s=j\omega$ and m1<m2; $Z_{m1}$ is the zero point, m1=1, 2, 3 ..., $P_{m2}$ is the pole, m2=1, 2, 3 ..., the zero and pole points are both negative real numbers; k is coefficient, $\tau_{min}$ is the shortest propagation time of the wave; $Z_{c,approx}(s)$ is the rational function approximation of characteristic impedance, $A_{approx}(s)$ is the rational function approximation of propagation coefficient;

Converting the functions into time domain:

$$Z_c(t) = k_0\delta(t) + k_1 e^{-p_1 t} + k_2 e^{-p_2 t} + \dots + k_{m1}e^{-p_{m1}t}$$

$$a(t) = \begin{cases} k_1 e^{-p_1(t-\tau_{min})} + k_2 e^{-p_2(t-\tau_{min})} + \dots + k_{m2}e^{-p_{m2}(t-\tau_{min})}, \\ 0 \end{cases}$$

if $t \geq \tau_{min}$
if $t < \tau_{min}$

Where $Z_c(t)$ is the time domain expression of the characteristic impedance, a(t) is the time domain expression of the propagation coefficient, $k_{m2}$ is the coefficient of the expanded rational function; the characteristic impedance $Z_c[n_1]$ and the propagation coefficient and corresponding to each sampling time $t[n_1]$ can be achieved;

Step A-2: in order to match the calculated characteristic impedance and propagation coefficient with the collected voltage and current in frequency domain, filtering the characteristic impedance and propagation coefficient by a sinc filter with a Blackman window;

Calculating the kernel $h[j_1]$ of a sinc filter with Blackman window:

$$\begin{cases} h[j_1] = K\dfrac{\sin(2\pi f_c(j_1 - M/2))}{j_1 - M/2} w[j_1] & (j_1 \neq M/2) \\ h[j_1] = 2\pi f_c & (j_1 = M/2) \end{cases}$$

Performing normalization:

$$h[j_1] = \frac{h[j_1]}{\sum_{i=1}^{M+1} h[j_1]}$$

Where $j_1=1, 2 \ldots M+1$, $f_c$ is the cut-off frequency having the value within the range of 0 to 0.5; M is the kernel length of the filter, which should be an even number; K is the coefficient; $w[j_1]$ is the function of Blackman window and is expressed as follows:

$$w[j_1]=0.42-0.5\cos(2\pi j_1/M)+0.08\cos(4\pi j_1/M)$$

Performing filtering:

$$z_{cfilter}[n_1+j_1-1]=\sum_{j_1=1}^{M+1}h[j_i]z_c[n_1],$$

$$a_{filter}[n_1+j_1-1]=\sum_{j_1=1}^{M+1}h[j_i]a[n_1],$$

Where $n_1=1, 2 \ldots N_t$; $Z_{cfilter}$ is the filtered characteristic impedance; $a_{filter}$ is the filtered propagation coefficient; the filtered signal has a delay of M/2 point compared with the original signal, so the filtered point corresponding to the sampling time $t[n_1]$ is $Z_{cfilter}[n_1+M/2]$ and $a_{filter}[n_1+M/2]$.

Step A-3: reducing the sampling frequency of the filtered characteristic impedance and propagation coefficient corresponding to the full length of the transmission line to the resampling frequency $f_{maxres}$ ($f_{maxres}<f_{max}$):

Calculating the number of resampling points $N_{tres}$ in the time domain:

$$N_{tres}=t_{max}\cdot f_{maxres}$$

Calculating the sampling time $t_{new}[n_2]$ ($n_2=1, 2, 3 \ldots N_{tres}$) corresponding to the $n_2^{th}$ sampling point:

$$t_{new}[n_2]=(n_2-1)/f_{maxres}$$

Obtaining the resampled sampling value by linear interpolation method:

$$z_{cres}[n_2]=\frac{z_{c2}-z_{c1}}{t_2-t_1}\cdot(t_{new}[n_2]-t_1)+z_{c1}$$

$$a_{res}[n_2]=\frac{a_2-a_1}{t_2-t_1}\cdot(t_{new}[n_2]-t_1)+a_1$$

Where $Z_{cres}$ is the resampled characteristic impedance; $a_{res}$ is the resampled propagation coefficient; $t_1$ and $t_2$ are two adjacent sampling times in the original sampling time series t, and $t_1 \leq t_{new}[n_2] \leq t_2$; $z_{c1}$ and $z_{c2}$ are sampling values corresponding to the sampling times $t_1, t_2$ in the filtered characteristic impedance $Z_{cfilter}$, respectively; $a_1$ and $a_2$ are sampling values corresponding to the sampling times $t_1, t_2$ in the filtered propagation coefficient $a_{filter}$, respectively.

Step B: collecting a head end voltage value $u_m$, a head end current value $i_m$, a tail end voltage value $u_n$, a tail end current value $i_n$ of the sampling transmission line, a sampling frequency $f_s$ ($f_s<f_{maxres}$), and a number of the sampling voltage and current $N_s$. In order to match the voltage and current sampling rate with the propagation constant within a shorter length of the line and obtain an accurate calculation result, waveform reduction and calculation of modulus components of voltage and current are adopted in the present invention. According to the waveform reduction method, the sampling frequency is increased to the resampling f frequency, maxres and phase mode transformation is performed. The detailed steps are as follows:

Step B-1: calculating according to the waveform reduction method in Step B is as follows:

a): Setting the frequency for traveling-wave transmission calculation as $f_{maxres}$; inserting zero points to the original signal $x[i_2]$ according to the new sampling rate, $i_2=1, 2, \ldots N_s$, so that the number of sampling points is changed from $N_s$ to $N_x$ ($N_x=N_s\cdot N_{add}$, $N_{add}=f_{maxres}/f_s$), thus obtaining a recombinant signal $x_{rec}[i_3]$ ($i_3=1, 2 \ldots N_x$):

$x_{rec}[1+(i_2-1)\cdot N_{dd}]=x[i_2]$, the values of the rest points are zero; Where x represents the sampling values including voltages $u_m$, $u_n$ and currents $i_m$, $i_n$ at the sampling frequency $f_s$; and $x_{rec}$ represents the sampling values including voltages $u_{mrec}$, $u_{nrec}$ and currents $i_{mrec}$, $i_{nrec}$ at the sampling frequency $f_{max}$ after inserting the zero points;

b): filtering the recombinant signal $x_{rec}[i_3]$ using the sinc filter with Blackman window, setting a cut-off frequency $f_{c2}=1/(2\cdot N_{add})$, choosing an appropriate kernel length $M_2$ and a kernel $h_2[j_2]$ of the filter, and filtering out harmonics at higher frequencies:

$$x_{restore}[i_3+j_2-1]=\sum_{j_2=1}^{M_2+1}h_2[j_2]x_{rec}[i_3]$$

Where $j_2=1, 2 \ldots M_2+1$ and $i_3=1, 2 \ldots N_x$; $x_{restore}$ represents the voltage values $u_{mrestore}$, $u_{nrestore}$ and currents values $i_{mrestore}$, $i_{nrestore}$ after waveform reduction;

c): intercepting the restored voltage and current signals, namely, removing the previous and subsequent $M_2/2$ sampling points of the signal $x_{restore}$; the restored signal is $x_{restore}[i_3+M_2/2]$ corresponding to the sampling time $t[i_3]$, the intercepted signal after waveform reduction is $x_{re}[n_3]$ ($n_3=1, 2 \ldots N_x-M_2/2$), and $x_{re}[n_3]=x_{restore}[n_3+M_2/2]$; $x_{re}$ represents the intercepted voltage values $u_{mre}$, $u_{nre}$ and intercepted currents values $i_{mre}$, $i_{nre}$ after waveform reduction.

Step B-2: performing phase mode transformation:

$$\begin{bmatrix}u_{mmod1}\\u_{mmod2}\end{bmatrix}=\begin{bmatrix}\frac{\sqrt{2}}{2}&\frac{\sqrt{2}}{2}\\\frac{\sqrt{2}}{2}&-\frac{\sqrt{2}}{2}\end{bmatrix}\begin{bmatrix}u_{mp}\\u_{mn}\end{bmatrix}$$

$$\begin{bmatrix}u_{nmod1}\\u_{nmod2}\end{bmatrix}=\begin{bmatrix}\frac{\sqrt{2}}{2}&\frac{\sqrt{2}}{2}\\\frac{\sqrt{2}}{2}&-\frac{\sqrt{2}}{2}\end{bmatrix}\begin{bmatrix}u_{np}\\u_{nn}\end{bmatrix}$$

$$\begin{bmatrix}i_{mmod1}\\i_{mmod2}\end{bmatrix}=\begin{bmatrix}\frac{\sqrt{2}}{2}&\frac{\sqrt{2}}{2}\\\frac{\sqrt{2}}{2}&-\frac{\sqrt{2}}{2}\end{bmatrix}\begin{bmatrix}i_{mp}\\i_{mn}\end{bmatrix}$$

$$\begin{bmatrix}i_{nmod1}\\i_{nmod2}\end{bmatrix}=\begin{bmatrix}\frac{\sqrt{2}}{2}&\frac{\sqrt{2}}{2}\\\frac{\sqrt{2}}{2}&-\frac{\sqrt{2}}{2}\end{bmatrix}\begin{bmatrix}i_{np}\\i_{nn}\end{bmatrix}$$

Where the voltage values $u_{mmod1}$, $u_{nmod1}$ and current values $i_{mmod1}$, $i_{nmod1}$ are ground-mode components after waveform reduction; and voltage values $u_{mmod2}$, $u_{nmod2}$ and current values $i_{mmod2}$, $n_{nmod2}$ are differential-mode components after waveform reduction; the voltage values $u_{mp}$, $u_{mn}$ are p-phase and n-phase of the voltage value $u_{mre}$, respectively; the voltage values $u_{np}$, $u_{nn}$ are p-phase and n-phase of the voltage value $u_{nre}$, respectively; the current values $i_{mp}$, $i_{mn}$ are p-phase and n-phase of the current value $i_{mre}$, respectively; the current values $i_{np}$, $i_{nn}$ are p-phase and n-phase of the current value $i_{nre}$, respectively;

Step C: calculating differential values of voltage travelling-wave $u\text{wave}_{diffm}$ and $u\text{wave}_{diffn}$ at both ends, presetting a preset threshold value to $u_{set}$, determining whether the internal fault occurs on the transmission line based on the criterion of $u\text{wave}_{diffm}[n_3] \geq u_{set} \| u\text{wave}_{diffn}[n_3] \geq u_{set}$; since the present invention does not involve with the fault types, the fault identification is calculated using the voltage and current differential-mode components as follows:

Determining whether the internal fault occurs:

$$u\text{wave}_{diffm}[n_3] \geq u_{set} \| u\text{wave}_{diffn}[n_3] \geq u_{set}$$

When either of the values $u\text{wave}_{diffm}[n_3]$ and $u\text{wave}_{diffn}[n_3]$ is greater than the preset threshold value $u_{set}$, it is considered that an internal fault occurs at the time $t[n_3]$. In order to ensure the reliability of the determination, the determination is made continuously several times or by the integral method.

The calculation of the differential values of voltage travelling-wave is as follows:

$$u\text{wave}_{diffm}[n_3] = (u_{mmod2}[n_3] + z_{cres}[n_2] * i_{mmod2}[n_3]) * a_{res}[n_2] - (u_{nmod2}[n_3] - z_{cres}[n_2] * i_{nmod2}[n_3])$$

$$u\text{wave}_{diffn}[n_3] = (u_{nmod2}[n_3] + z_{cres}[n_2] * i_{nmod2}[n_3]) * a_{res}[n_2] - (u_{mmod2}[n_3] - z_{cres}[n_2] * i_{mmod2}[n_3])$$

Where $n_3 = 1, 2 \ldots N_x - M_2/2$ and $n_2 = 1, 2 \ldots N_{tres}$; * represents the convolution calculation, the value $u\text{wave}_{diffm}$ is the differential value between the differential-mode forward voltage traveling-wave at the head end after full-length line transmission and the differential-mode backward voltage traveling-wave at the tail end; the value $u\text{wave}_{diffn}$ is the differential value between the differential-mode forward voltage traveling-wave at the tail end after full-length line transmission and the differential-mode backward voltage traveling-wave at the head end.

The detailed steps of the convolution calculation are as follows:

Supposing $xx[j_3]$ is an input signal with $N_1$ points, $j_3$ is a positive integer from 1 to $N_1$, $hh[j_4]$ is an impulse response with $N_2$ points, and $j_4$ is a positive integer from 1 to $N_2$. The convolution result of $xx[j_3]$ and $hh[j_4]$ is $y[j_5]$, which is a signal with $N_1 + N_2 - 1$ point, $j_5$ is a positive integer from 1 to $N_1 + N_2 - 1$, then $$y[j_5] = \sum_{j_4=1}^{N_2} hh[j_4] xx[j_5 - j_4]$$

Where $j_5 = 1, 2 \ldots N_1 + N_2 - 1$ and $j_4 = 1, 2 \ldots N_2$.

Figure 2:
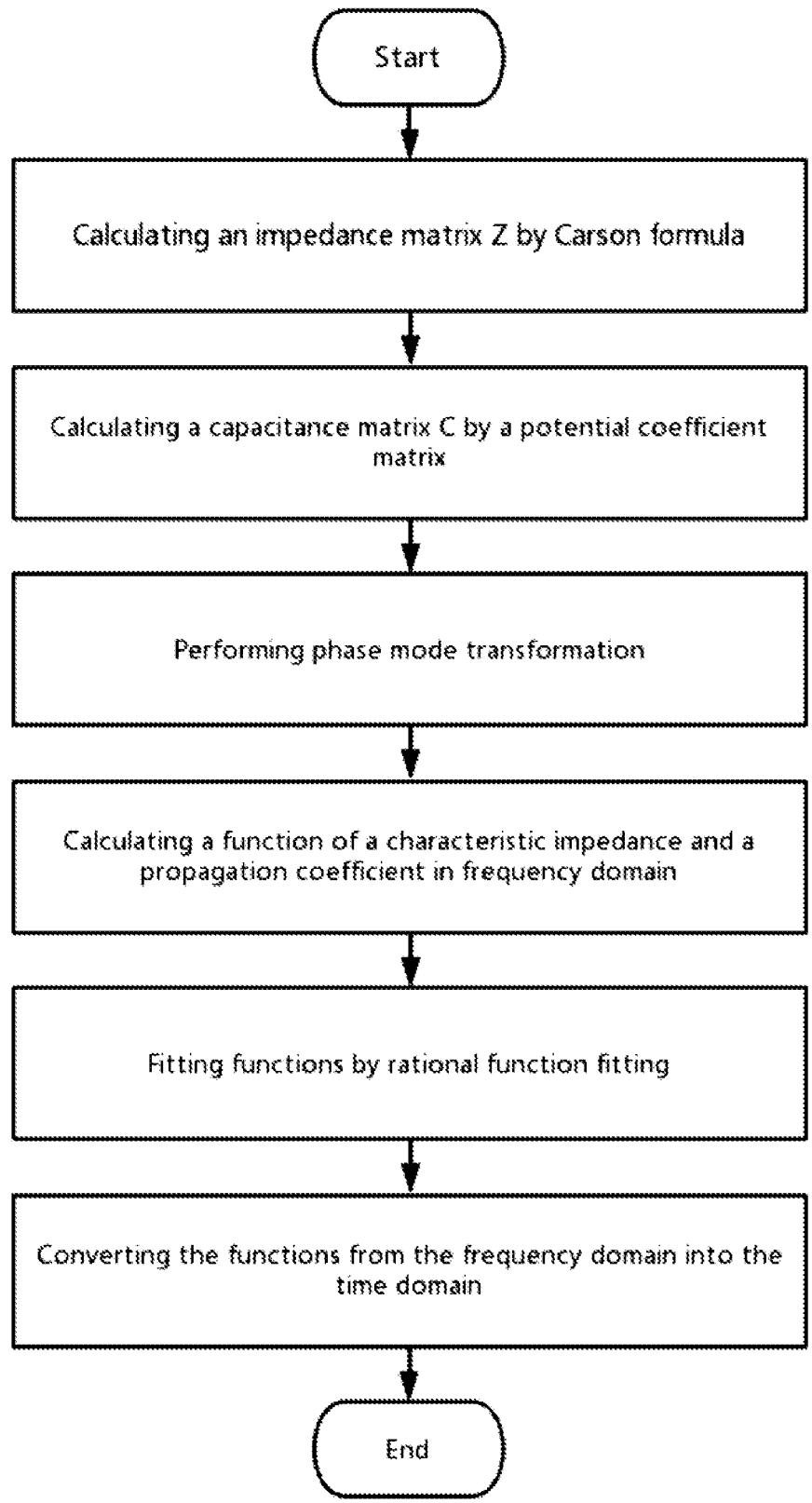
FIG. 2 is the calculation flow chart of the characteristic impedance and propagation coefficient of the transmission line in time domain.

The technical scheme of the present invention will be further described by the following embodiment:

Step A: calculating the characteristic impedance and propagation coefficient of the frequency-dependent transmission line in time domain; the detailed steps are as follows:

Step A-1: the VSC-HVDC transmission line is shown in FIG. 1. according to the conductance matrix G (generally ignored, can be set to 0) and the geometric transmission line parameters including the radius of conductor, the average above-ground height of the conductor, the distance between the conductor, the distance between the conductor and the mirror of another conductor, obtaining the impedance matrix of the conductor by the Carson formula, obtaining the capacitance matrix by the potential coefficient matrix, and then calculating the expression of the characteristic impedance and propagation coefficient corresponding to the full length l of the transmission line in frequency domain, and finally transforming it into the time domain by rational function fitting or inverse Fourier transformation, the detailed flow chart is shown in the FIG. 2;

Setting the sampling time $t_{max}$, the sampling frequency $f_{max}$, the number of sampling points $N_t$ in time domain and the number of sampling points $N_f$ in frequency domain as:

$$N_t = N_f = t_{max} f_{max}$$

Calculating the sampling time $t[n_1]$ ($n_1 = 1, 2, 3 \ldots N_t$) corresponding to the $n_1^{th}$ sampling point:

$$t[n_1] = (n_1 - 1)/f_{max}$$

Calculating the frequency $f[n_1]$ corresponding to the $n_1^{th}$ sampling point:

$$f[n_1] = (n_1 - 1)/t_{max}$$

a): calculating the impedance matrix Z by Carson formula:

Self-impedance $Z_{si}$ (i=1,2) is:

$$Z_{si} = (R_{i,ac} + \Delta R_{si}) + j\left(\omega \frac{\mu_0}{2\pi} \ln \frac{2h_i}{r_i} + X_{i,ac} + \Delta X_{si}\right)$$

Where $R_{i,ac}$ is the AC resistance of the conductor i, $X_{i,ac}$ is the AC reactance of the conductor i, $\Delta R_{si}$ and $\Delta X_{si}$ are Carson's correction terms for earth return effects, $h_i$ is the average above-ground height of the conductor i, $r_i$ is the radius of the conductor i, $\mu_0$ having the value of $4\pi \times 10^{-4}$ H/m is the uniform permeability for both the aerial space and the earth; and angular frequency $\omega = 2\pi f[n_1]$;

Mutual impedance $Z_{mij}$ (j=1,2 and j≠i) is:

$$Z_{mij} = Z_{mji} = \Delta R_{mij} + j\left(\omega \frac{\mu_0}{2\pi} \ln \frac{d_{ij,mir}}{d_{ij}} + \Delta X_{mij}\right)$$

Where $d_{ij}$ is the distance between conductor i and conductor j, $d_{ij,mir}$ is the distance between the conductor I and the mirror of conductor j, $\Delta R_{mij}$ and $\Delta X_{mij}$ are Carson's correction terms for earth return effects; and then $$Z = \begin{bmatrix} Z_{s1} & Z_{m12} \\ Z_{m21} & Z_{s2} \end{bmatrix};$$

b): calculating the potential coefficient matrix P:

$$P_{si} = \frac{1}{2\pi\varepsilon_0} \ln \frac{2h_i}{r_i}$$

$$P_{mij} = P_{mji} = \frac{1}{2\pi\varepsilon_0} \ln \frac{d_{ij,mir}}{d_{ij}}$$

Where $P_{si}$ is the diagonal element of matrix P, $P_{mij}$ is the off-diagonal element of matrix P, $\varepsilon_0$ is the space permittivity value having the value of $8.85 \times 10^{-12}$ F/m, and the capacitance matrix $C = P^{-1}$;

c): performing phase mode transformation:

$$Z' = SZ$$

$$C' = SC$$

$$G' = SG$$

Where Z' is the modulus of the impedance per unit length of the conductor, C' is the modulus of the capacitance per unit length of the conductor, G' is the modulus of the conductance per unit length of the conductor, and S is the decoupling matrix, $$S = \frac{1}{2}\begin{bmatrix} 1 & -1 \\ 1 & 1 \end{bmatrix};$$

d): calculating the function of the characteristic impedance $Z_c$ and the propagation coefficient A in frequency domain:

$$Z' = R' + j\omega L'$$

$$Z_c(\omega) = \sqrt{\frac{R' + j\omega L'}{G + j\omega C'}}$$

$$A(\omega) = e^{-l\sqrt{(R+j\omega L')(G+j\omega C')}}$$

Where R' is the resistance per unit length of the conductor, L' is the inductance per unit length of the conductor;

e): converting the functions from the frequency domain into the time domain by rational function fitting method:

Fitting the functions $Z_c(\omega)$ and $A(\omega)$ in the frequency domain by the rational function fitting method, the point where the slope of the fitted line changes is the pole and zero point of the rational function, so the approximate expression of the characteristic impedance and the propagation coefficient in the frequency domain are:

$$Z_{c,approx}(s) = k\frac{(s+z_1)(s+z_2)\ldots(s+z_{m1})}{(s+p_1)(s+p_2)\ldots(s+p_{m1})}$$

$$A_{approx}(s) = e^{-s\tau_{min}}k\frac{(s+z_1)(s+z_2)\ldots(s+z_{m1})}{(s+p_1)(s+p_2)\ldots(s+p_{m2})}$$

Where $s = j\omega$ and $m1 < m2$; $Z_{mi}$ is the zero point, $m1 = 1, 2, 3 \ldots$, $P_{m2}$ is the pole, $m2 = 1, 2, 3 \ldots$, the zero and pole points are both negative real numbers; k is coefficient, $\tau_{min}$ is the shortest propagation time of the wave; $Z_{c,approx}(s)$ is the rational function approximation of characteristic impedance, $A_{approx}(s)$ is the rational function approximation of propagation coefficient;

Converting the functions into the time domain:

$$Z_C(t) = k_0\delta(t) + k_1 e^{-p_1 t} + k_2 e^{-p_2 t} + \ldots + k_{m1}e^{-p_{m1}t}$$

$$a(t) = \begin{cases} k_1 e^{-p_1(t-\tau_{min})} + k_2 e^{-p_2(t-\tau_{min})} + \ldots + k_{m2}e^{-p_{m2}(t-\tau_{min})}, & \text{if } t \geq \tau_{min} \\ 0, & \text{if } t < \tau_{min} \end{cases}$$

Where $Z_c(t)$ is the time domain expression of the characteristic impedance, a(t) is the time domain expression of the propagation coefficient, $k_{m2}$, is the coefficient of the expanded rational function; the characteristic impedance $Z_c[n_1]$ and the propagation coefficient and corresponding to each sampling time $t[n_1]$ can be achieved;

Step A-2: in order to match the calculated characteristic impedance and propagation coefficient with the collected voltage and current in frequency domain, filtering the characteristic impedance and propagation coefficient using a sinc filter with a Blackman window;

Calculating the kernel $h[j_1]$ of a sinc filter with Blackman window:

$$\begin{cases} h[j_1] = K\frac{\sin(2\pi f_c(j_1 - M/2))}{j_1 - M/2}w[j_1] & j_1 \neq M/2 \\ h[j_1] = 2\pi f_c & j_1 = M/2 \end{cases}$$

Performing normalization:

$$h[j_1] = \frac{h[j_1]}{\sum_{i=1}^{M+1} h[j_1]}$$

Where $j_1 = 1, 2 \ldots M+1$, $f_c$ is the cut-off frequency having the value within the range of 0 to 0.5; if the transmission line is short but the sampling frequency $f_{max}$ is high, when performing convolution calculation with voltage and current values, it is required to reduce the sampling frequency to $f_{maxres}$, so $f_c = 1/(2 \times (f_{max}/f_{maxres} + 1))$. Wherein M is the kernel length of the filter, which should be an even number and corresponding to the cut-off frequency, which can have the value of $4f_c$; K is the coefficient; $w[j_1]$ is the function of Blackman window and is expressed as follows:

$$w[j_1] = 0.42 - 0.5\cos(2\pi j_1/M) + 0.08\cos(4\pi j_1/M)$$

Performing filtering:

$$z_{cfilter}[n_1 + j_1 - 1] = \sum_{j_1=1}^{M+1} h[j_1]z_c[n_1],$$

$$a_{filter}[n_1 + j_1 - 1] = \sum_{j_1=1}^{M+1} h[j_1]a[n_1]$$

Where $n_1 = 1, 2 \ldots N_t$; $Z_{cfilter}$ is the filtered characteristic impedance; $a_{filter}$ is the filtered propagation coefficient; the filtered signal has a delay of M/2 point compared with the original signal, so the filtered point corresponding to the sampling time $t[n_1]$ is $Z_{cfilter}[n_1+M/2]$ and $a_{filter}[n_1+M/2]$.

Step A-3: reducing the sampling frequency of the filtered characteristic impedance and propagation coefficient corresponding to the full length of the transmission line to the resampling frequency $f_{maxres}$ ($f_{maxres}<f_{max}$):

Calculating the number of resampling points $N_{tres}$ in the time domain:

$$N_{tres}=t_{max}\cdot f_{maxres}$$

Calculating the sampling time $t_{new}[n_2]$ ($n_2=1, 2, 3 \ldots N_{tres}$) corresponding to the $n_2^{th}$ sampling point:

$$t_{new}[n_2]=(n_2-1)/f_{maxres}$$

Obtaining the resampled sampling value by linear interpolation method:

$$z_{cres}[n_2] = \frac{z_{c2} - z_{c1}}{t_2 - t_1} \cdot (t_{new}[n_2] - t_1) + z_{c1}$$

$$a_{res}[n_2] = \frac{a_2 - a_1}{t_2 - t_1} \cdot (t_{new}[n_2] - t_1) + a_1$$

Where $Z_{cres}$ is the resampled characteristic impedance; $a_{res}$ is the resampled propagation coefficient; $t_1$ and $t_2$ are two adjacent sampling times in the original sampling time series t, and $t_1 \le t_{new}[n_2] \le t_2$; $z_{c1}$ and $z_{c2}$ are sampling values corresponding to the sampling times $t_1$, $t_2$ in the filtered characteristic impedance $Z_{cfilter}$, respectively; $a_1$ and $a_2$ are sampling values corresponding to the sampling times $t_1$, $t_2$ in the filtered propagation coefficient $a_{filter}$, respectively.

Figure 3:
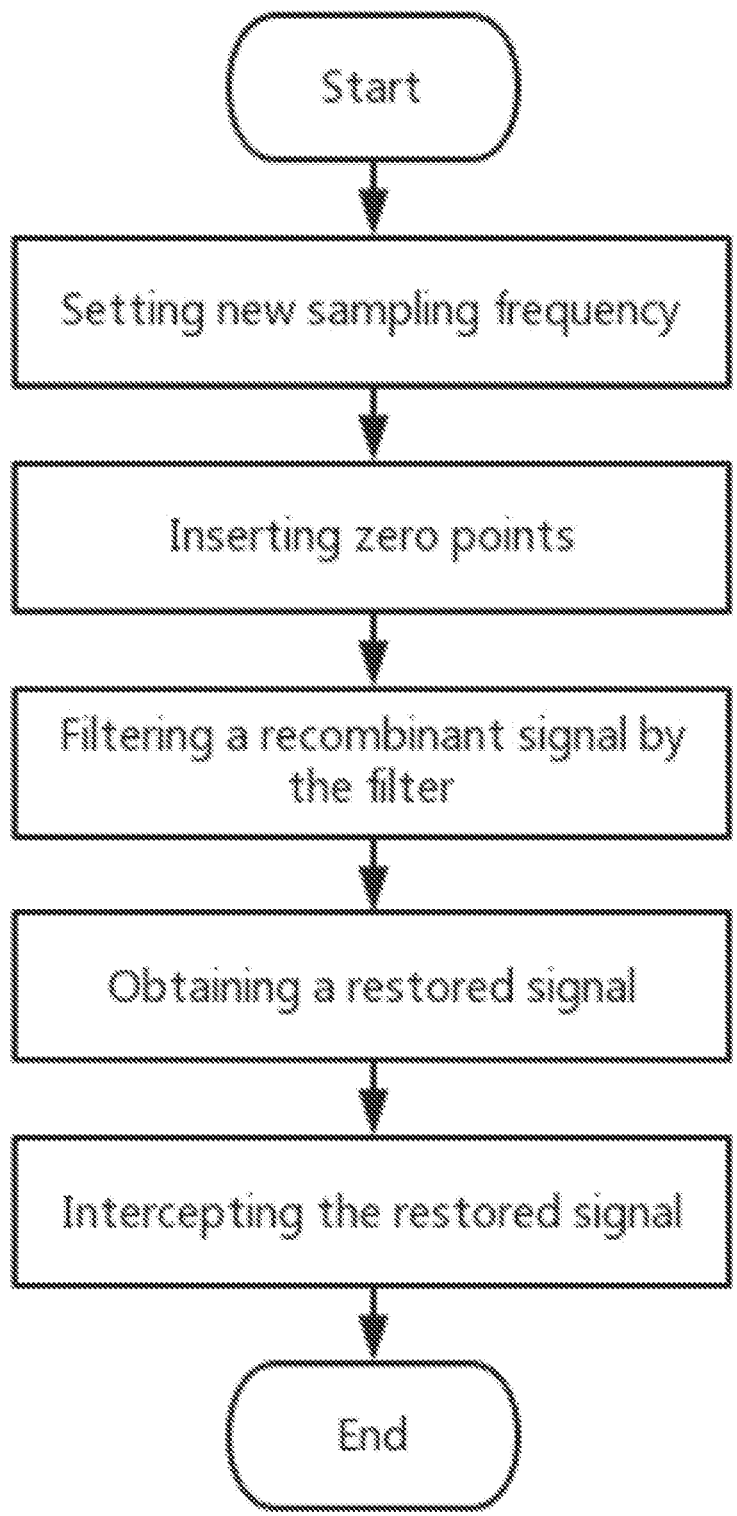
FIG. 3 is the flow chart of the waveform reduction method.

Step B: collecting a head end voltage value $u_m$, a head end current value $i_m$, a tail end voltage value $u_n$, a tail end current value $i_n$ of the sampling transmission line, a sampling frequency $f_s$ ($f_s(f_s<f_{maxres}$), and a number of the sampling voltage and current $N_s$. In order to match the voltage and current sampling rate with the propagation constant within a shorter length of the line and obtain an accurate calculation result, waveform reduction and calculation of modulus components of voltage and current are adopted in the present invention. According to the waveform reduction method, the sampling frequency is increased to a resampling frequency $f_{maxres}$ and phase mode transformation is performed. The detailed steps are as follows:

Step B-1: as shown in FIG. 3, calculating according to the waveform reduction method in Step B is as follows:

a): Setting the frequency for traveling-wave transmission calculation as $f_{maxres}$, inserting zero points to the original signal $x[i_2]$ according to the new sampling rate, $i_2=1, 2, \ldots N$ so that the number of sampling points is changed from $N_s$ to $N_x$ ($=N_s\cdot N_{add}$, $N_{add}=f_{maxres}/f_s$), thus obtaining a recombinant signal $x_{rec}[i_3]$ ($i_3=1, 2 \ldots N_x$):

$x_{rec}[1+(i_2-1)\cdot N_{add}]=x[i_2]$, the values of the rest points are zero;

Where x represents the sampling values including voltages $u_m$, $u_n$ and currents $i_m$, $i_n$ at the sampling frequency $f_s$; and $x_{ree}$ represents the sampling values including voltages $u_{mrec}$, and currents $i_{mrec}$, $i_{nrec}$ at the sampling frequency $f_{max}$ after inserting the zero points;

b): filtering the recombinant signal $x_{rec}[i_3]$ using the sinc filter with Blackman window, setting a cut-off frequency $f_{c2}=1/(2\cdot N_{add})$, choosing an appropriate kernel length $M_2$ and a kernel $h_2[j_2]$ of the filter, and filtering out harmonics at higher frequencies:

$$x_{restore}[i_3 + j_2 - 1] = \sum_{j_2=1}^{M_2+1} h_2[j_2]x_{rec}[i_3]$$

Where $j_2=1, 2 \ldots M_2+1$ and $i_3=1, 2 \ldots N_x$; $x_{restore}$ represents the voltage values $u_{mrestore}$, $u_{nrestore}$ and currents values $i_{mrestore}$, $i_{nrestore}$ after waveform reduction;

c): intercepting the restored voltage and current signals, namely, removing the previous and subsequent $M_2/2$ sampling points of the signal $x_{restore}$; the restored signal is $x_{restore}[i_3+M_2/2]$ corresponding to the sampling time $t[i_3]$, the intercepted signal after waveform reduction is $x_{re}[n_3]$ ($n_3=1, 2 \ldots N_x-M_2/2$), and $x_{re}[n_3]=x_{restore}[n_3+M_2/2]$; $x_{re}$ represents the intercepted voltage values $u_{mre}$, $u_{nre}$ and intercepted currents values $i_{mre}$, $i_{nre}$ after waveform reduction.

Step B-2: performing phase mode transformation:

$$\begin{bmatrix} u_{mmod1} \\ u_{mmod2} \end{bmatrix} = \begin{bmatrix} \frac{\sqrt{2}}{2} & \frac{\sqrt{2}}{2} \\ \frac{\sqrt{2}}{2} & -\frac{\sqrt{2}}{2} \end{bmatrix} \begin{bmatrix} u_{mp} \\ u_{mn} \end{bmatrix}$$

$$\begin{bmatrix} u_{nmod1} \\ u_{nmod2} \end{bmatrix} = \begin{bmatrix} \frac{\sqrt{2}}{2} & \frac{\sqrt{2}}{2} \\ \frac{\sqrt{2}}{2} & -\frac{\sqrt{2}}{2} \end{bmatrix} \begin{bmatrix} u_{np} \\ u_{nn} \end{bmatrix}$$

$$\begin{bmatrix} i_{mmod1} \\ i_{mmod2} \end{bmatrix} = \begin{bmatrix} \frac{\sqrt{2}}{2} & \frac{\sqrt{2}}{2} \\ \frac{\sqrt{2}}{2} & -\frac{\sqrt{2}}{2} \end{bmatrix} \begin{bmatrix} i_{mp} \\ i_{mn} \end{bmatrix}$$

$$\begin{bmatrix} i_{nmod1} \\ i_{nmod2} \end{bmatrix} = \begin{bmatrix} \frac{\sqrt{2}}{2} & \frac{\sqrt{2}}{2} \\ \frac{\sqrt{2}}{2} & -\frac{\sqrt{2}}{2} \end{bmatrix} \begin{bmatrix} i_{np} \\ i_{nn} \end{bmatrix}$$

Where the voltage values $u_{mmod1}$, $u_{nmod1}$ and current values $i_{mmod1}$, $i_{nmod1}$ are ground-mode components after waveform reduction; and voltage values $u_{mmod2}$, $u_{nmod2}$ and current values $i_{mmod2}$, $i_{nmod2}$ are differential-mode components after waveform reduction; the voltage values $u_{mp}$, $u_{mp}$ are p-phase and n-phase of the voltage value $u_{mre}$, respectively; the voltage values $u_{np}$, $u_{nn}$ are p-phase and n-phase of the voltage value $u_{nre}$, respectively; the current values $i_{mp}$, $i_{mn}$ are p-phase and n-phase of the current value $i_{mre}$, respectively; the current values $i_{np}$, $i_{nn}$ are p-phase and n-phase of the current value $i_{nre}$, respectively;

Step C: calculating the differential values of voltage travelling-wave uwave$_{diffm}$ and uwave$_{diffn}$ at both ends, presetting a preset threshold value $u_{set}$, determining whether the internal fault occurs on the transmission line based on the criterion of uwave$_{diffm}[n_3]\ge u_{set}$||uwave$_{diffn}[n_3]\ge u_{set}$; since the present invention does not involved with the fault types, the fault identification is calculated using the voltage and current differential-mode components as follows:

Determining whether the internal fault occurs:

$$u\text{wave}_{diffm}[n_3]\ge u_{set}||u\text{wave}_{diffn}[n_3]\ge u_{set}$$

When either of the values uwave$_{diffm}$[n$_3$] and uwave$_{diffn}$[n$_3$] is greater than the preset threshold value u$_{set}$, it is considered that the internal fault occurs at a time t[n$_3$]. In order to ensure the reliability of the determination, the determination is made continuously several times or by the integral method.

The calculation of the differential values of voltage travelling-wave is as follows:

$$u\text{wave}_{diffm}[n_3]=u_{mfw}[n_3]*a_{res}[n_2]-u_{nbw}[n_3]$$

$$u\text{wave}_{diffn}[n_3]=u_{nfw}[n_3]*a_{res}[n_2]-u_{mbw}[n_3]$$

Where the value uwave$_{diffm}$ is the differential value between the differential-mode forward voltage traveling-wave at the head end after full-length line transmission and the differential-mode backward voltage traveling-wave at the tail end; the value uwave$_{diffn}$ is the differential value between the differential-mode forward voltage traveling-wave at the tail end after full-length line transmission and the differential-mode backward voltage traveling-wave at the head end;

The calculation of the voltage travelling-wave is as follows:

$$u_{mfw}[n_3]u_{mmod2}[n_3]+z_{cres}[n_2]*i_{mmod2}[n_3]$$

$$u_{nfw}[n_3]=u_{nmod2}[n_3]+z_{cres}[n_2]*i_{nmod2}[n_3]$$

$$u_{mbw}[n_3]=u_{mmod2}[n_3]+z_{cres}[n_2]*i_{mmod2}[n_3]$$

$$u_{nbw}[n_3]=u_{nmod2}[n_3]-z_{cres}[n_2]*i_{nmod2}[n_3]$$

Where n$_3$=1, 2 . . . N$_x$–M$_2$/2 and n$_2$=1, 2 . . . N$_{tres}$; * represents the convolution calculation, u$_{mfw}$ is a differential-mode forward voltage traveling-wave at the head end, u$_{mbw}$ is the differential-mode backward voltage traveling-wave at the head end, u$_{nfw}$ is a differential-mode forward voltage traveling-wave at the tail end, u$_{nbw}$ is the differential-mode backward voltage traveling-wave at the tail end.

The detailed steps of the convolution calculation are as follows:

Supposing xx[j$_3$] is an input signal with N$_1$ points, j$_3$ is a positive integer from 1 to N$_1$, hh[j$_4$] is an impulse response with N$_2$ points, and j$_4$ is a positive integer from 1 to N$_2$. The convolution result of xx[j$_3$] and hh[j$_4$] is y[j$_5$], which is a signal with N$_1$+N$_2$–1 points, j$_5$ is a positive integer from 1 to N$_1$+N$_2$–1, then $$y[j_5] = \sum_{j_4=1}^{N_2} hh[j_4]xx[j_5 - j_4]$$

Where j$_5$=1, 2 . . . N$_1$+N$_2$–1 and j$_4$=1, 2 . . . N$_2$. Only the first N$_x$ signals are adopted during the calculation of the voltage traveling-wave differential values.

Although the functions and working processes of the present invention have been described above with reference to the accompanying drawings, the present invention is not limited thereto. The foregoing specific implementations are merely illustrative but not limiting. A person of ordinary skill in the art may make various forms under the teaching of the present invention without departing from the purpose of the present invention and the protection scope of the appended claims, and all the forms shall fall into the protection scope of the present invention.

What is claimed is:

1. A calculation method for travelling-wave differential protection of VSC-HVDC transmission lines, considering the influence of the frequency-related parameters, comprising the following steps:

calculating a characteristic impedance and a propagation coefficient of a frequency-dependent transmission line in time domain;

collecting voltage and current signals at the both ends of the transmission line and then calculating a forward and a backward voltage travelling-wave, respectively;

comparing a differential value of voltage travelling-wave with a preset threshold value so as to determine whether an internal fault occurs;

wherein the method comprises detailed steps as follows:

Step A: calculating the characteristic impedance and propagation coefficient of the frequency-dependent transmission line in time domain;

Step B: collecting the voltage and current signals at the both ends of the transmission line, comprising a head end voltage value u$_m$, a head end current value i$_m$, a tail end voltage value u$_n$, a tail end current value i$_n$ of the transmission line, a sampling frequency f$_s$, and a number of the sampling voltage and current N$_s$; according to the waveform reduction method, filtering and intercepting the voltage and current signals using a filter with kernel length of M$_2$ and then increasing the sampling frequency f$_s$ to a resampling frequency f$_{maxres}$ (f$_{maxres}$>f$_s$), and the number of sampling points becoming N$_x$–M$_2$/2, wherein N$_x$=N$_s$*f$_{maxres}$/f$_s$; and performing phase mode transformation;

Step C: comparing a differential value of voltage travelling-wave with a preset voltage threshold value so as to determine whether the internal fault occurs:

calculating differential values of voltage travelling-wave uwave$_{diffm}$ and uwave$_{diffn}$ at both ends, presetting a preset threshold value u$_{set}$, determining whether the internal fault occurs on the transmission line based on the criterion of uwave$_{diffm}$[n$_3$≥u$_{set}$||uwave$_{diffn}$[n$_3$]≥u$_{set}$ (n$_3$=1, 2 . . . N$_x$–M$_2$/2 differential-mode components of voltage and current to realize fault recognition; further, determining whether the internal fault occurs:

$$u\text{wave}_{diffm}[n_3]\ge u_{set}||u\text{wave}_{diffn}[n_3]\ge u_{set}$$

when either of uwave$_{diffm}$[n$_3$] or uwave$_{diffn}$[n$_3$] is greater than the preset threshold value u$_{set}$, it is considered that the internal fault occurs at a time t[n$_3$]; in order to ensure the reliability of the determination, the determination is made continuously several times or by the integral method.

2. The calculation method for travelling-wave differential protection of VSC-HVDC transmission lines according to claim 1, wherein the detailed steps of Step A are as follows:

Step A-1: according to a conductance matrix G and geometric transmission line parameters including a radius of conductor, an average above-ground height of the conductor, a distance between the conductors, a distance between the conductor and the mirror of another conductor, obtaining an impedance matrix of the conductor by the Carson formula, obtaining a capacitance matrix using a potential coefficient matrix, and then calculating the expression of the characteristic impedance and propagation coefficient corresponding to a full length/of the transmission line in frequency domain, and finally transforming it into the time domain by rational function fitting or inverse Fourier transformation;

Step A-2: in order to match the calculated characteristic impedance and propagation coefficient with the collected voltage and current in frequency domain, filtering the characteristic impedance and propagation coefficient using a sinc filter with a Blackman window;

Step A-3: reducing the sampling frequency of the filtered characteristic impedance and propagation coefficient corresponding to the full length of the transmission line to to the resampling frequency $f_{maxres}$.

3. The calculation method for travelling-wave differential protection of VSC-HVDC transmission lines according to claim 2, wherein the detailed steps of Step A-1 are as follows:

Setting a sampling time $t_{max}$, a sampling frequency $f_{max}$, a number of sampling points $N_t$ in time domain and a number of sampling points $N_f$ in frequency domain as:

$$N_t = N_f = t_{max} \cdot f_{max}$$

Calculating a sampling time $t[n_1]$ corresponding to the $n_1^{th}$ sampling point:

$$t[n_1] = (n_1-1)/f_{max}$$

$n_1 = 1, 2, 3 \ldots N_t$, calculating a frequency $f[n_1]$ corresponding to the $n_1^{th}$ sampling point:

$$f[n_1] = (n_1-1)/t_{max}$$

a): calculating an impedance matrix Z using Carson formula:
Self-impedance $Z_{si}$ (i=1,2) is:

$$Z_{si} = (R_{i,ac} + \Delta R_{si}) + j\left(\omega \frac{\mu_0}{2\pi} \ln \frac{2h_i}{r_i} + X_{i,ac} + \Delta X_{si}\right)$$

Where $R_{i,ac}$ is an AC resistance of a conductor i, $X_{i,ac}$ is an AC reactance of the conductor i, $\Delta R_{si}$ and $\Delta X_{si}$ are Carson's correction terms for earth return effects, $h_i$ is the average above-ground height of the conductor i, $r_i$ is the radius of the conductor i, $\mu_0$ having the value of $4\pi \times 10^{-4}$ H/m is the uniform permeability for both the aerial space and the earth and angular frequency $\omega = 2\pi f[n_1]$;

Mutual impedance $Z_{mij}$ is:

$$Z_{mij} = Z_{mji} = \Delta R_{mij} + j\left(\omega \frac{\mu_0}{2\pi} \ln \frac{d_{ij,mir}}{d_{ij}} + \Delta X_{mij}\right)$$

Where j=1,2 and j≠i, $d_{ij}$ is a distance between conductor i and conductor j, $d_{ij,mir}$ is a distance between the conductor i and the mirror of the conductor j, $\Delta R_{mij}$ and $\Delta X_{mij}$ are Carson's correction terms for earth return effects; and then $$z = \begin{bmatrix} Z_{s1} & Z_{m12} \\ Z_{m21} & Z_{s2} \end{bmatrix};$$

b): calculating a potential coefficient matrix P:

$$P_{si} = \frac{1}{2\pi\varepsilon_0} \ln \frac{2h_i}{r_i}$$

$$P_{mij} = P_{mji} = \frac{1}{2\pi\varepsilon_0} \ln \frac{d_{ij,mir}}{d_{ij}}$$

Where $P_{si}$ is a diagonal element of the matrix P, $P_{mij}$ is a off-diagonal element of the matrix P, $\varepsilon_0$ is a space permittivity value having the value of $8.85 \times 10^{-12}$ F/m, and a capacitance matrix $C = P^{-1}$;

c): performing phase mode transformation:

$$Z' = SZS^{-1}$$

$$C' = SCS^{-1}$$

$$G' = SGS^{-1}$$

Where Z' is a modulus of the impedance per unit length of the conductor, C' is a modulus of the capacitance per unit length of the conductor, G' is a modulus of the conductance per unit length of the conductor, and S is a decoupling matrix, $$S = \frac{1}{2}\begin{bmatrix} 1 & 1 \\ 1 & -1 \end{bmatrix};$$

d): calculating a function of a characteristic impedance $Z_c$ and a propagation coefficient A in frequency domain:

$$Z' = R' + j\omega L'$$

$$Z_c(\omega) = \sqrt{\frac{R' + j\omega L'}{G' + j\omega C'}}$$

$$A(\omega) = e^{-l\sqrt{(R'+j\omega L)(G'+j\omega C)}}$$

Where R' is a resistance per unit length of the conductor, L' is a inductance per unit length of the conductor;

e): converting the functions from the frequency domain into the time domain by rational function fitting method:

Fitting functions $Z_c(\omega)$ and $A(\omega)$ in the frequency domain by the rational function fitting method, a point where the slope of the fitted line changes is a pole and a zero point of the rational function, so the approximate expression of the characteristic impedance and the propagation coefficient in the frequency domain are:

$$Z_{c,approx}(s) = k\frac{(s+z_1)(s+z_2)\ldots(s+z_{m1})}{(s+p_1)(s+p_2)\ldots(s+p_{m1})}$$

$$A_{approx}(s) = e^{-s\tau_{min}}k\frac{(s+z_1)(s+z_2)\ldots(s+z_{m1})}{(s+p_1)(s+p_2)\ldots(s+p_{m2})}$$

Where $s=j\omega$ and $m1 < m2$; $Z_{mi}$ is the zero point, $m1=1, 2, 3\ldots$, $P_{m2}$ is the pole, $m2=1, 2, 3\ldots$, the zero and pole points are both negative real numbers; k is a coefficient, $\tau_{min}$ is the shortest propagation time of the wave; $Z_{c,approx}(S)$ is the rational function approximation of characteristic impedance, $A_{approx}(S)$ is the rational function approximation of propagation coefficient;

Converting the functions into the time domain:

$$Z_o(t) = k_0\delta(t) + k_1 e^{-p_2 t} + k_2 e^{-p_2 t} + \ldots + k_{m1} e^{-p_{m1} t}$$

$$a(t) = \begin{cases} k_1 e^{-p_1(t-\tau_{min})} + k_2 e^{-p_2(t-\tau_{min})} + \ldots + k_{m2} e^{-p_{m2}(t-\tau_{min})}, & \text{if } t \geq \tau_{min} \\ 0 & \text{if } t < \tau_{min} \end{cases}$$

Where $Z_c(t)$ is a time domain expression of the characteristic impedance, a(t) is a time domain expression of the propagation coefficient, $k_{m2}$ is a coefficient of the expanded rational function; a characteristic impedance $Z_b[n_1]$ and a propagation coefficient $a[n_1]$ corresponding to each sampling time $t[n_1]$ can be achieved.

4. The calculation method for travelling-wave differential protection of VSC-HVDC transmission lines according to claim 2, wherein the detailed steps of Step A-2 are as follows:

Calculating the kernel $h[j_1]$ of a sinc filter with Blackman window:

$$\begin{cases} h[j_1] = K \frac{\sin(2\pi f_c(j_1 - M/2))}{j_1 - M/2} w[j_1] & (j_1 \neq M/2) \\ h[j_1] = 2\pi f_c & (j_1 = M/2) \end{cases}$$

Performing normalization:

$$h[j_1] = \frac{h[j_1]}{\sum_{i=1}^{M+1} h[j_1]}$$

Where $j_1 = 1, 2 \ldots M+1$, $f_c$ is a cut-off frequency having the value within the range of 0 to 0.5; M is a kernel length of the filter, which should be an even number; K is a coefficient; $w[j_1]$ is the function of Blackman window and is expressed as follows:

$$w[j_1] = 0.42 - 0.5 \cos(2\pi j_1/M) + 0.08 \cos(4\pi j_1/M)$$

Performing Filtering $$Z_{cfilter}[n_1 + j_1 - 1] = \sum_{j_1=1}^{M+1} h[j_1] \to z_c[n_1],$$

$$a_{filter}[n_1 + j_1 - 1] = \sum_{j_1=1}^{M+1} h[j_1] a[n_1]$$

Where $n_1 = 1, 2 \ldots N_t$; $Z_{cfilter}$ is a filtered characteristic impedance; $a_{filter}$ is a filtered propagation coefficient; the filtered signal has a delay of M/2 point compared with the original signal, so the filtered point corresponding to the sampling time $t[n_1]$ is $Z_{cfilter}[n^1+M/2]$ and $a_{filter}[n_1+M/2]$.

5. The calculation method for travelling-wave differential protection of VSC-HVDC transmission lines according to claim 2, wherein the detailed steps of Step A-3 are as follows:

Calculating number of resampling points $N_{tres}$ in the time domain:

$$N_{tres} = t_{max} \cdot f_{maxres}$$

Where $f_{maxres}$ is the resampled sampling frequency;

Calculating the sampling time $t_{new}[n_2]$ corresponding to the $n_2^{th}$ sampling point:

$$t_{new}[n_2] = (n_2 - 1)/f_{maxres}$$

Where $n_2 = 1, 2, 3 \ldots N_{tres}$;

Obtaining a resampled sampling value by linear interpolation method:

$$z_{cres}[n_2] = \frac{z_{c2} - z_{c1}}{t_2 - t_1} \cdot (t_{new}[n_2] - t_1) + z_{c1}$$

$$a_{res}[n_2] = \frac{a_2 - a_1}{t_2 - t_1} \cdot (t_{new}[n_2] - t_1) + a_1$$

Where $Z_{cres}$ a the resampled characteristic impedance; $a_{res}$ is a resampled propagation coefficient; $t_1$ and $t_2$ are two adjacent sampling times in an original sampling time series t, and $t_1 \leq t_{new}[n_2] \leq t_2$; $z_{c1}$ and $z_{c2}$ are sampling values corresponding to the sampling times $t_1$, $t_2$ in the filtered characteristic impedance $Z_{cfilter}$, respectively; $a_1$ and $a_2$ are sampling values corresponding to the sampling times $t_1$, $t_2$ in the filtered propagation coefficient $a_{filter}$, respectively.

6. The calculation method for travelling-wave differential protection of VSC-HVDC transmission lines according to claim 1, wherein the detailed steps of calculating according to the waveform reduction method in the Step B are as follows:

a): Setting the frequency for traveling-wave transmission calculation as $f_{maxres}$, inserting zero points to an original signal $x[i_2]$ according to the new sampling rate, $i_2 = 1, 2, \ldots N_s$, so that the number of sampling points is changed from $N_s$ to $N_x$, $N_x = N_s \cdot N_{add}$, $N_{add} = f_{maxres}/f_s$, thus obtaining a recombinant signal $x_{rec}[i_3]$:

$$x_{rec}[1 + (i_2 - 1) \cdot N_{dd}] = x[i_2],$$ the values of the rest points are zero;

Where $i_3 = 1, 2 \ldots N_x$, x represents sampling values including voltages $u_m$, $u_n$ and currents $i_m$, $i_n$ at the sampling frequency $f_s$; and $x_{rec}$ represents sampling values including voltages $u_{mrec}$, $u_{nrec}$ and currents $i_{mrec}$, $i_{nrec}$ at the sampling frequency $f_{max}$ after inserting the zero points;

b): filtering the recombinant signal $x_{rec}[i_3]$ using the sinc filter with Blackman window, setting a cut-off frequency $f_{c2} = 1/(2 \cdot N_{add})$, choosing an appropriate kernel length $M_2$ and a kernel $h_2[j_2]$ of the filter, and filtering out harmonics at higher frequencies:

$$x_{restore}[i_3 + j_2 - 1] = \sum_{j_2=1}^{M_2+1} h_2[j_2] x_{rec}[i_3]$$

Where $j_2 = 1, 2 \ldots M_2+1$ and $i_3 = 1, 2 \ldots N_x$; $X_{restore}$ represents voltage values $u_{mrestore}$, $u_{nrestore}$ and currents values $i_{mrestore}$, $i_{nrestore}$ after waveform reduction;

c): intercepting the restored voltage and current signals, namely, removing the previous and subsequent $M_2/2$ sampling points of the signal $X_{restore}$; the restored signal is $x_{restore}[i_3 + M_2/2]$ corresponding to the sampling time $t[i_3]$, the intercepted signal after waveform reduction is $x_{re}[n_3]$ ($n_3 = 1, 2 \ldots N_x - M_2/2$), and $x_{re}[n_3] = x_{restore}[n_3 + M_2/2]$; represents intercepted voltage values $u_{mre}$, $u_{nre}$ and intercepted currents values $i_{mre}$, $i_{nre}$ after waveform reduction.

7. The calculation method for travelling-wave differential protection of VSC-HVDC transmission lines according to claim 1, wherein the detailed steps of performing phase mode transformation in the Step B are as follows:

$$\begin{bmatrix} u_{mmod1} \\ u_{mmod2} \end{bmatrix} = \begin{bmatrix} \frac{\sqrt{2}}{2} & \frac{\sqrt{2}}{2} \\ \frac{\sqrt{2}}{2} & -\frac{\sqrt{2}}{2} \end{bmatrix} \begin{bmatrix} u_{mp} \\ u_{mn} \end{bmatrix}$$

-continued $$\begin{bmatrix} u_{nmod1} \\ u_{nmod2} \end{bmatrix} = \begin{bmatrix} \frac{\sqrt{2}}{2} & \frac{\sqrt{2}}{2} \\ \frac{\sqrt{2}}{2} & -\frac{\sqrt{2}}{2} \end{bmatrix} \begin{bmatrix} u_{np} \\ u_{nn} \end{bmatrix}$$

$$\begin{bmatrix} i_{mmod1} \\ i_{mmod2} \end{bmatrix} = \begin{bmatrix} \frac{\sqrt{2}}{2} & \frac{\sqrt{2}}{2} \\ \frac{\sqrt{2}}{2} & -\frac{\sqrt{2}}{2} \end{bmatrix} \begin{bmatrix} i_{mp} \\ i_{mn} \end{bmatrix}$$

$$\begin{bmatrix} i_{nmod1} \\ i_{nmod2} \end{bmatrix} = \begin{bmatrix} \frac{\sqrt{2}}{2} & \frac{\sqrt{2}}{2} \\ \frac{\sqrt{2}}{2} & -\frac{\sqrt{2}}{2} \end{bmatrix} \begin{bmatrix} i_{np} \\ i_{nn} \end{bmatrix}$$

Where voltage values $u_{mmod1}$, $u_{nmod1}$ and current values $i_{mmod1}$, $i_{nmod1}$ are ground-mode components after waveform reduction; and voltage values $u_{mmod2}$, $u_{nmod2}$ and current values $i_{mmod2}$, $i_{nmod2}$ are differential-mode components after waveform reduction; voltage values $u_{mp}$, $u_{mn}$ are p-phase and n-phase of the voltage value $u_{mre}$, respectively; voltage values $u_{np}$, $u_{nn}$ are p-phase and n-phase of the voltage value $u_{nre}$, respectively; current values $i_{mp}$, $i_{mn}$ are p-phase and n-phase of the current value $i_{mre}$, respectively; current values $i_{np}$, $i_{nn}$ are p-phase and n-phase of the current value $i_{nre}$, respectively.

8. The calculation method for travelling-wave differential protection of VSC-HVDC transmission lines according to claim 1, wherein the detailed steps of Step C are as follows:

Calculating the differential values of voltage travelling-wave at both ends:

$u\text{wave}_{diffm}[n_3] = (u_{mmod2}[n_3] + z_{cres}[n_2] * i_{mmod2}[n_3]) * a_{res}[n_2] - (u_{mmod2}[n_3] - z_{cres}[n_2] * i_{nmod2}[n_3])$ $u\text{wave}_{diffn}[n_3] = (u_{nmod2}[n_3] + z_{cres}[n_2] * i_{nmod2}[n_3]) * a_{res}[n_2] - (u_{mmod2}[n_3] - z_{cres}[n_2] * i_{mmod2}[n_3])$ Where $n_3 = 1, 2 \ldots N_x - M_2/2$ and $n_2 = 1, 2 \ldots N_{tres}$; * represents the convolution calculation, the value $u\text{wave}_{diffm}$ is the differential value between the differential-mode forward voltage traveling-wave at the head end after full-length line transmission and the differential-mode backward voltage traveling-wave at the tail end; the value $u\text{wave}_{diffn}$ is the differential value between the differential-mode forward voltage traveling-wave at the tail end after full-length line transmission and the differential-mode backward voltage traveling-wave at the head end;

Calculating the convolution calculation:

Supposing $xx[j_3]$ is an input signal with $N_1$ points, $j_3$ is a positive integer from 1 to $N_1$, $hh[j_4]$ is an impulse response with $N_2$ points, and $j_4$ is a positive integer from 1 to $N_2$; the convolution result of $xx[j_3]$ and $hh[j_4]$ is $y[j_5]$, which is a signal with $N_1 + N_2 - 1$ points, $j_5$ is a positive integer from 1 to $N_1 + N_2 - 1$, then $$y[j_5] = \sum_{j_4=1}^{N_2} hh[j_4] xx[j_5 - j_4]$$

Where $j_5 = 1, 2 \ldots N_1 + N_2 - 1$ and $j_4 = 1, 2 \ldots N_2$.

* * * * *